(12) United States Patent
Jeng et al.

(10) Patent No.: US 12,198,996 B2
(45) Date of Patent: Jan. 14, 2025

(54) INTEGRATED FAN-OUT PACKAGE, PACKAGE-ON-PACKAGE STRUCTURE, AND MANUFACTURING METHOD THEREOF

(71) Applicant: Taiwan Semiconductor Manufacturing Company, Ltd., Hsinchu (TW)

(72) Inventors: Shin-Puu Jeng, Hsinchu (TW); Hsien-Wen Liu, Hsinchu (TW); Shih-Ting Hung, New Taipei (TW); Yi-Jou Lin, Hsinchu (CN); Tzu-Jui Fang, Hsinchu (CN); Po-Yao Chuang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 387 days.

(21) Appl. No.: 17/382,385

(22) Filed: Jul. 22, 2021

(65) Prior Publication Data

US 2021/0358824 A1 Nov. 18, 2021

Related U.S. Application Data

(63) Continuation of application No. 15/939,314, filed on Mar. 29, 2018, now Pat. No. 11,075,132.

(Continued)

(51) Int. Cl.
*H01L 23/31* (2006.01)
*H01L 21/48* (2006.01)
(Continued)

(52) U.S. Cl.
CPC ...... *H01L 23/3114* (2013.01); *H01L 21/4853* (2013.01); *H01L 21/486* (2013.01); *H01L 21/56* (2013.01); *H01L 21/563* (2013.01); *H01L 23/3128* (2013.01); *H01L 23/528* (2013.01); *H01L 23/5384* (2013.01); *H01L 23/5386* (2013.01); *H01L 23/5389* (2013.01);
(Continued)

(58) Field of Classification Search
CPC ............ H01L 2224/13147; H01L 2224/13139
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Moazzam Hossain
*Assistant Examiner* — Hajar Kolahdouzan
(74) *Attorney, Agent, or Firm* — JCIPRNET

(57) ABSTRACT

An integrated fan-out package includes a first redistribution structure, a die, a plurality of conductive structures, an encapsulant, and a second redistribution structure. The die is bonded to the first redistribution structure through flip-chip bonding. The conductive structures surround the die. The encapsulant encapsulates the die and the conductive structures. The second redistribution structure is disposed on the encapsulant and is electrically connected to the first redistribution structure through the conductive structures. The second redistribution structure includes at least one conductive pattern layer that is in physical contact with the encapsulant. Top surfaces of the conductive structures contacting the second redistribution structure are coplanar with a top surface of the encapsulant.

20 Claims, 7 Drawing Sheets

Related U.S. Application Data

(60) Provisional application No. 62/551,242, filed on Aug. 29, 2017.

(51) Int. Cl.
    *H01L 21/56*     (2006.01)
    *H01L 23/00*     (2006.01)
    *H01L 23/528*     (2006.01)
    *H01L 23/538*     (2006.01)
    *H01L 25/00*     (2006.01)
    *H01L 25/065*     (2023.01)
    *H01L 25/10*     (2006.01)

(52) U.S. Cl.
CPC .............. *H01L 24/03* (2013.01); *H01L 24/19* (2013.01); *H01L 24/20* (2013.01); *H01L 24/82* (2013.01); *H01L 25/0657* (2013.01); *H01L 25/105* (2013.01); *H01L 25/50* (2013.01); *H01L 21/568* (2013.01); *H01L 2221/68318* (2013.01); *H01L 2221/68345* (2013.01); *H01L 2221/68381* (2013.01); *H01L 2224/0401* (2013.01); *H01L 2224/16227* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01); *H01L 2225/1023* (2013.01); *H01L 2225/1041* (2013.01); *H01L 2225/1058* (2013.01); *H01L 2924/15311* (2013.01); *H01L 2924/15331* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0322343 A1* | 11/2016 | Scanlan .................. H01L 24/19 |
| 2017/0040266 A1* | 2/2017 | Lin ..................... H01L 23/5389 |

* cited by examiner

INTEGRATED FAN-OUT PACKAGE, PACKAGE-ON-PACKAGE STRUCTURE, AND MANUFACTURING METHOD THEREOF

CROSS-REFERENCE TO RELATED APPLICATION

This application is a continuation application of and claims the priority benefit of a prior application Ser. No. 15/939,314, filed on Mar. 29, 2018. The prior application Ser. No. 15/939,314 claims the priority benefit of U.S. provisional application Ser. No. 62/551,242, filed on Aug. 29, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, the improvement in integration density has come from repeated reductions in minimum feature size, which allows more of the smaller components to be integrated into a given area. These smaller electronic components also require smaller packages that utilize less area than previous packages.

Currently, integrated fan-out packages are becoming increasingly popular for their compactness. In the integrated fan-out packages, formation of the redistribution structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
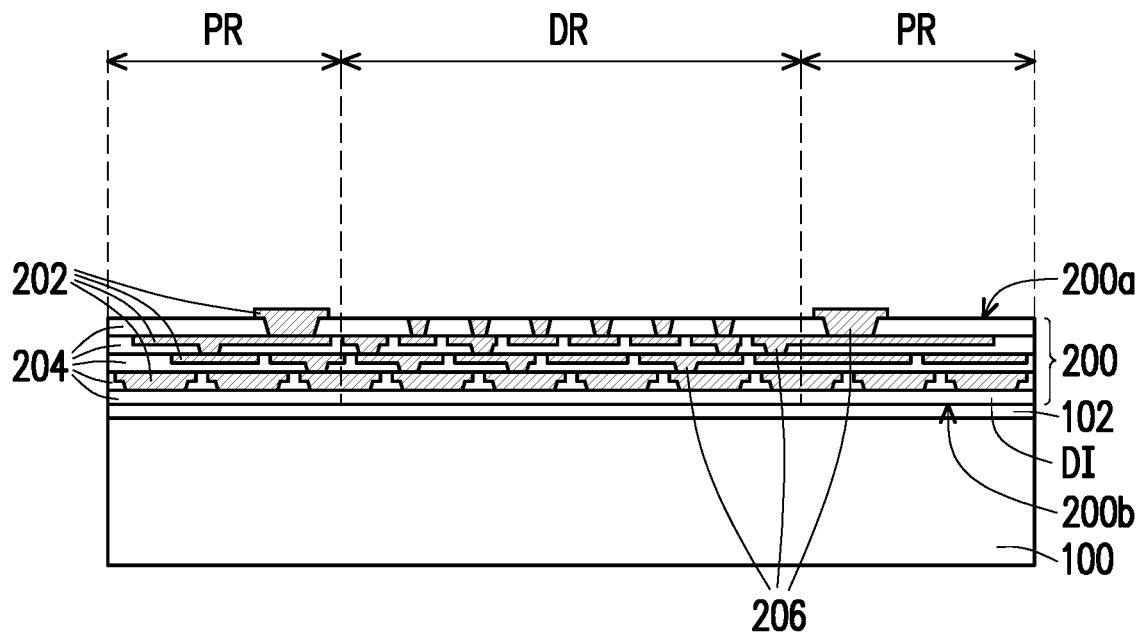
FIGS. 1A-1J are schematic cross-sectional views illustrating a process flow for manufacturing a package-on-package (PoP) structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are schematic cross-sectional views illustrating a process flow for manufacturing a package-on-package (PoP) structure 10 in accordance with some embodiments of the disclosure. Referring to FIG. 1A, a carrier 100 having a de-bonding layer 102 formed thereon is provided. In some embodiments, the carrier 100 is a glass substrate. However, other material may be adapted as a material of the carrier 100 as long as the material is able to withstand the subsequent processes while carrying the package structure formed thereon. In some embodiments, the de-bonding layer 102 is a light-to-heat conversion (LTHC) release layer formed on the glass substrate. The de-bonding layer 102 may allow the structure formed on the carrier 100 in the subsequent processes to be peeled off from the carrier 100.

A first redistribution structure 200 is formed over the carrier 100 and the de-bonding layer 102. The first redistribution structure 200 has a first surface 200a and a second surface 200b opposite to the first surface 200a. In some embodiments, the second surface 200b faces the carrier 100. In some embodiments, the second surface 200b is attached to the de-bonding layer 102. The first redistribution structure 200 also includes a die attachment region DR and a peripheral region PR surrounding the die attachment region DR. In some embodiments, the first redistribution structure 200 includes a plurality of redistribution conductive layers 202 and a plurality of dielectric layers 204 stacked alternately. The redistribution conductive layers 202 are interconnected with one another by conductive vias 206 embedded in the dielectric layers 204. In some embodiments, the bottommost layer of the dielectric layers 204 (the bottommost dielectric layer DI) is in contact with the de-bonding layer 102. In some embodiments, the topmost layer of the redistribution conductive layers 202 is exposed from the topmost layer of the dielectric layers 204. In other words, the exposed topmost layer of the redistribution conductive layer 202 may include a plurality of pads to serve the purpose of electrical connection with other components formed subsequently. In some embodiments, the foregoing pads include redistribution pads (routing pads) and/or bump pads. In some embodiments, the material of the redistribution conductive layer 202 and the conductive vias 206 includes aluminum, titanium, copper, nickel, tungsten, and/or alloys thereof. The redistribution conductive layer 202 may be formed by, for example, electroplating, deposition, and/or photolithography and etching. In some embodiments, the material of the dielectric layers 204 includes polyimide, epoxy resin, acrylic resin, phenol resin, benzocyclobutene (BCB), polybenzoxazole (PBO), or any other suitable polymer-based dielectric material. Other than the materials listed above, the bottommost dielectric layer DI may also include periodic mesoporous organosilica (PMO), low temperature polyimide (LTPI), or the like. The dielectric layer 204, for example, may be formed by suitable fabrication techniques such as spin-on coating, chemical vapor deposition (CVD), plasma-enhanced chemical vapor deposition (PECVD) or the like.

It should be noted that although four layers of the redistribution conductive layers 202 and five layers of the dielectric layers 204 are illustrated in FIG. 1A, the number of these layers is not limited in this disclosure. In some alternative embodiments, the first redistribution structure 200 may be constituted by more or less layers of the redistribution conductive layer 202 and the dielectric layer 204 depending on the circuit design. Similarly, the number of the pads in the topmost layer of the redistribution conductive layer 202 is also not limited by the embodiments disclosed herein.

Figure 1B:
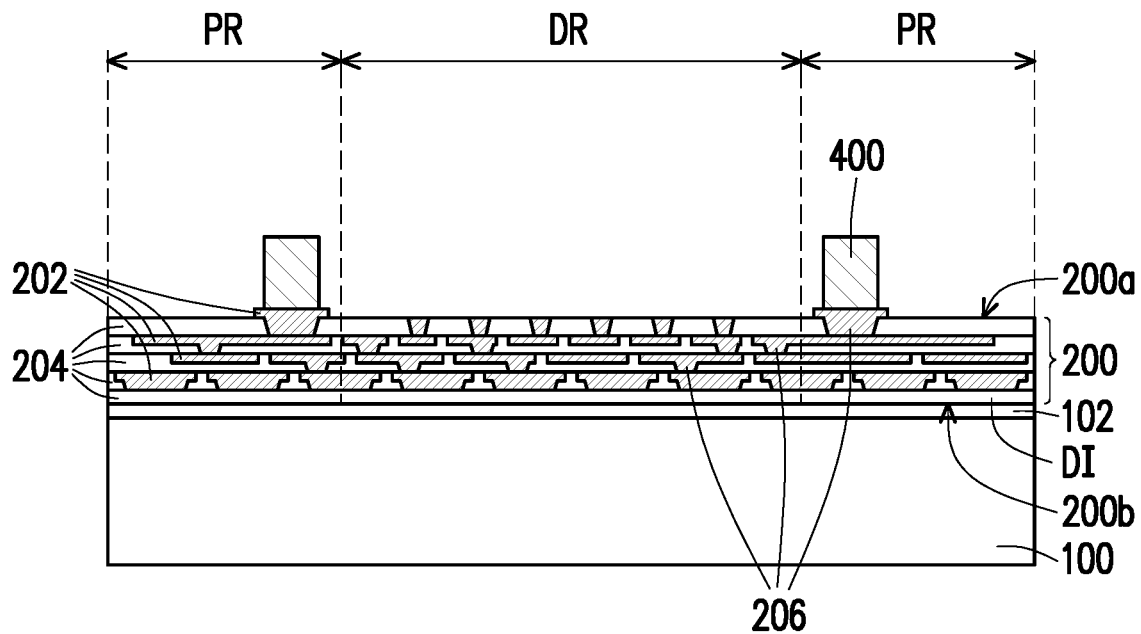

Referring to FIG. 1B, a plurality of conductive structures 400 is formed over the first surface 200a of the first redistribution structure 400. The conductive structures 400 are located within the peripheral region PR of the first redistribution structure 200. In some embodiments, the conductive structures 400 are conductive pillars formed by photolithography, plating, photoresist stripping processes or any other suitable method. In some embodiments, the conductive structures 400 may be formed by first forming a mask pattern (not shown) covering the first surface 200a of the first redistribution structure 200. The mask pattern has openings exposing the topmost redistribution conductive layer 202 located in the peripheral region PR. Thereafter, a metallic material is filled into the openings by electroplating or deposition. Subsequently, the mask pattern is removed to obtain the conductive structures 400. However, the disclosure is not limited thereto. Other suitable methods may be utilized in the formation of the conductive structures 400. In some embodiments, the material of the conductive structures 400 may include a metal material such as copper, copper alloys, or the like. In some embodiments, the conductive structures 400 are formed on the topmost redistribution conductive layer 202 and are in contact with the topmost redistribution conductive layer 202 to render electrical connection with the first redistribution structure 200. It should be noted that only two conductive structures 400 are presented in FIG. 1C for illustrative purposes; however, more than two conductive structures 400 may be formed in some alternative embodiments. The number of the conductive structures 400 may be selected based on demand.

Figure 1C:
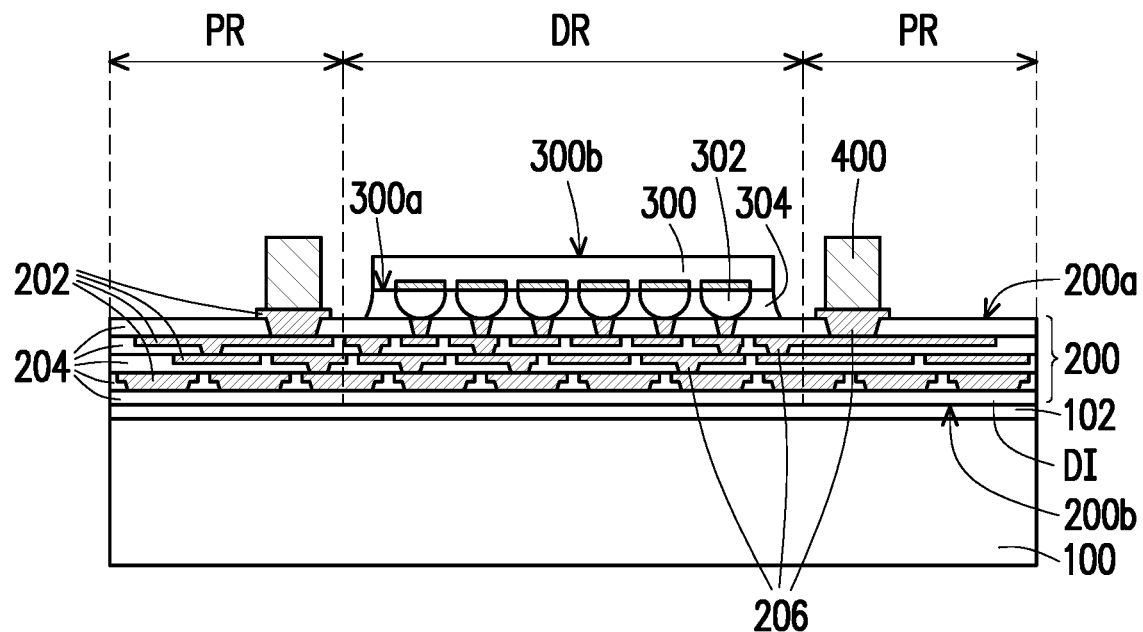

Referring to FIG. 1C, a die 300 is disposed over the first surface 200a of the first redistribution structure 200. The die 300 is placed within the die attachment region DR of the first redistribution structure 200. Since the peripheral region PR surrounds the die attachment region DR, the conductive structures 400 may be arranged to surround the die 300. In some embodiments, the die 300 is coupled to the first surface 200a of the first redistribution structure 200 through flip-chip bonding. For example, the die 300 has an active surface 300a facing the first surface 200a of the redistribution structure 200 and a rear surface 300b opposite to the active surface 300a. In some embodiments, the die 300 may be electrically connected to the first redistribution structure 200 through a plurality of conductive bumps 302 that are located between the active surface 300a of the die 300 and the topmost layer of the redistribution conductive layers 202 (the topmost redistribution conductive layer 202). In some embodiments, the conductive bumps 302 are solder bumps, silver balls, copper balls, or any other suitable metallic balls. In some embodiments, a soldering flux (not shown) may be applied onto the conductive bumps 302 for better adhesion. In some embodiments, an underfill layer 304 may be applied to fill into gaps between the die 300, the first redistribution structure 200, and the conductive bump 302 to enhance the reliability. In some alternative embodiments, the underfill layer 304 may be omitted. In some alternative embodiments, no underfill is provided between the die 300 and the first redistribution structure 200. Although FIG. 1B and FIG. 1C illustrated that the formation of the conductive structures 400 is prior to the formation of the die 300, the disclosure is not limited thereto. In some alternative embodiments, the conductive structures 400 may be provided after the formation of the die 300. Referring to FIG. 1A and FIG. 1C, since the first redistribution structure 200 is formed prior to the placement of the die 300, in some embodiments, the foregoing process may be considered as a "RDL first method." Moreover, since the die 300 is coupled to the first surface 200a of the first redistribution structure 200 through flip-chip bonding, a die attach film (DAF) or a film on wire (FOW) utilized in conventional package structures for adhering the die may be eliminated. As a result, an overall thickness of the subsequently formed package structure may be effectively reduced.

Figure 1D:
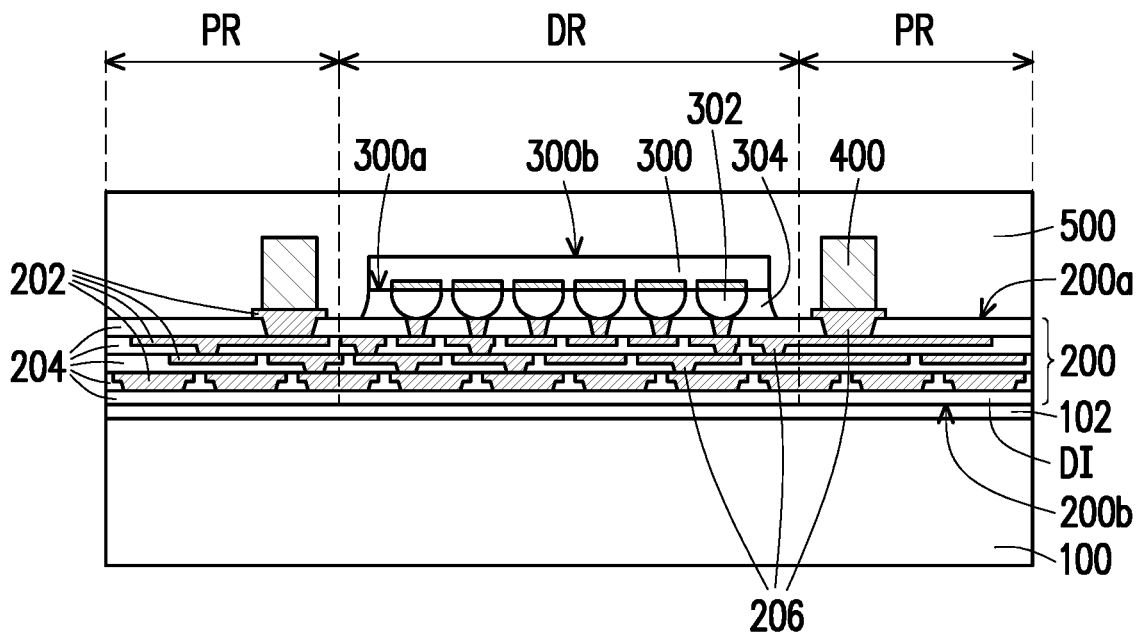

Referring to FIG. 1D, an encapsulant 500 is formed on the first redistribution structure 200. The encapsulant 500 covers and encapsulates the die 300 and the conductive structures 400. In some embodiments, the encapsulant 500 is a molding compound formed by an over-molding process. In some alternative embodiments, the material of the encapsulant 500 includes epoxy resins or other suitable resins. During this stage, the die 300 and the conductive structures 400 are not revealed and are well protected by the encapsulant 500.

Figure 1E:
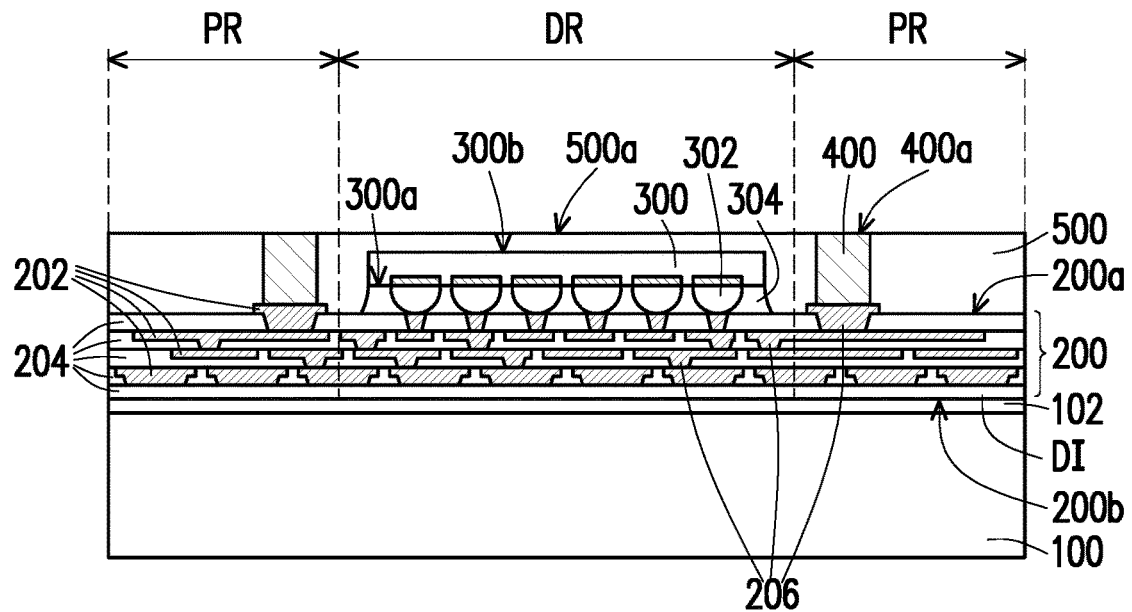

Referring to FIG. 1E, the encapsulant 500 is planarized until top surfaces 400a of the conductive structures 400 are exposed. In some embodiments, after the top surfaces 400a of the conductive structures 400 are exposed, the encapsulant 500 and the conductive structures 400 are further grinded to reduce the overall thickness of the package structure. However, the encapsulant 500 and the conductive structures 400 are grinded in a manner such that the rear surface 300b of the die 300 is still well protected and not revealed by the encapsulant 500. Referring to FIG. 1E, after the planarization process, a top surface 500a of the encapsulant 500 is substantially coplanar with the top surfaces 400a of the conductive structures 400. Since the conductive structures 400 penetrate through the encapsulant 500, in some embodiments, the conductive structures 400 may be referred to as through interlayer vias (TIVs) or through integrated fan-out (InFO) vias. The encapsulant 500 may be planarized through a grinding process or a chemical mechanical polishing (CMP) process, for example. After the planarization or the grinding process, a cleaning step may be optionally performed to remove the residues generated. However, the disclosure is not limited thereto and the planarization process may be performed through any other suitable method.

Figure 1F:
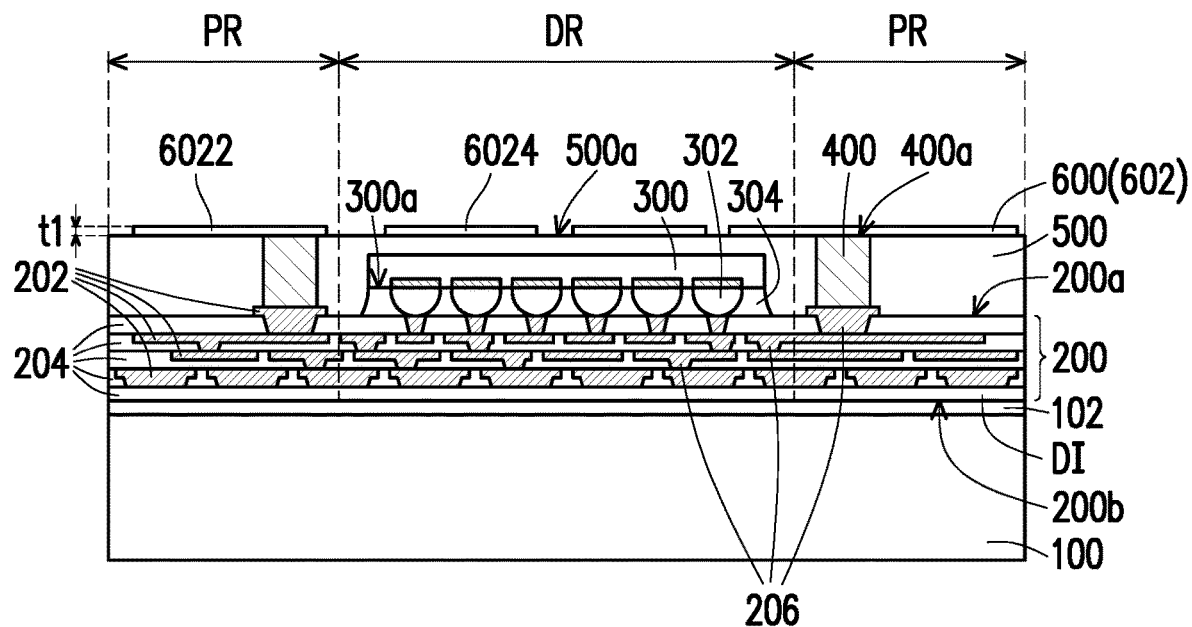

Referring to FIG. 1F, after the encapsulant 500 is planarized to expose the conductive structures 400, a second redistribution structure 600 is formed on the encapsulant 500 and the conductive structures 400. In some embodiments, the conductive structures 400 are connected with the second redistribution structure 600. The second redistribution structure 600 is electrically connected with the first redistribution structure 200 through the conductive structures 400. In some embodiments, the second redistribution structure 600 includes at least one conductive pattern layer 602 and the conductive pattern layer 602 is in physical contact with the encapsulant 500. In other words, the conductive structures 400 are in direct contact with the conductive pattern layer 602 and no dielectric layer is sandwiched between the said conductive pattern layer 602 and the encapsulant 500. For example, referring to FIG. 1F, in some embodiments, the second redistribution structure 600 is a single-layered structure of the conductive pattern layer 602, and the single layered structure of the conductive pattern layer 602 is directly in contact with the encapsulant 500. The conductive pattern layer 602 may further includes a plurality of ball pads 6022 for electrical connection with other electronic elements and routing patterns 6024. In some embodiments, the ball pads 6022 are disposed corresponding to the conductive structures 400 located underneath the ball pads 6022. For example, each ball pad 6022 may correspond to one conductive structure 400. In some embodiments, the conductive pattern layer 602 extends from the peripheral region PR into the die attachment region DR. In some embodiments, the ball pads 6022 are located in the peripheral region PR while the routing patterns 6024 are located in the die attachment region DR. In some alternative embodiments, the ball pads 6022 are located in both of the peripheral region PR and the die attachment region DR, so the space above the die 300 may be effectively utilized for electrical connection. In some embodiments, the second redistribution structure 600 (the conductive pattern layer 602) is formed to have a thickness t1 of 1 μm to 30 μm. It should be noted that the single-layered second redistribution structure 600 presented in FIG. 1F is merely an illustrative example of the second redistribution structure 600, and the disclosure is not limited thereto. In some alternative embodiments, the second redistribution structure 600 may be a multi-layered structure. The descriptions with respect to said multi-layered redistribution structure will be discussed in greater detail later accompanied by FIG. 2.

Referring back to FIG. 1F, the material of the conductive pattern layer 602 includes, for example, aluminum, titanium, copper, nickel, tungsten, and/or alloys thereof. In some embodiments, the conductive pattern layer 602 of the second redistribution structure 600 may be formed by first sputtering a seed layer (not shown) over the encapsulant 500 and the conductive structures 400. The seed layer may include a titanium layer, a copper layer, a titanium/copper composite layer, or any other suitable conductive material layer. Subsequently, a patterned photoresist layer (not shown) with openings may be disposed over the seed layer to outline the contour of the conductive pattern layer 602 of the second redistribution structure 600. Thereafter, a plating process may be performed to deposit the conductive pattern layer 602 onto the seed layer exposed by the openings of the patterned photoresist layer. Lastly, the patterned photoresist layer and the seed layer shielded by the patterned photoresist layer are removed together to form the second redistribution structure 600 illustrated in FIG. 1F.

In some embodiments, due to the sequence of the process steps, after the formation of the first redistribution structure 200, the conductive pattern layer 602 of the second redistribution structure 600 is formed directly on the encapsulant 500 without forming one or more dielectric layer on the encapsulant 500. In certain embodiments, since the conductive pattern layer 602 of the second redistribution structure 600 is directly in physical contact with the conductive structures 400 and no dielectric layer exists there-between, laser drilling for removing the dielectric layer and exposing the conductive structures may be omitted. Therefore, the overall production cost may be reduced. In addition, as no dielectric layer is formed between the encapsulant 500 and the conductive pattern layer 602 and no DAF/FOW layer is formed between the die 300 and the conductive pattern layer 602, void issues seen in the conventional dielectric layer and the conventional adhesive layer may be eliminated, thereby further improving the planarity of the package structure. As a result, the breakage of the conductive traces/routing patterns in the redistribution structure may be sufficiently eliminated, so as to enhance the reliability of the package structure. Moreover, in some embodiments, since the conductive pattern layer 602 of the second redistribution structure 600 is directly formed on the encapsulant 500 with no dielectric layer exists there-between, the thickness t1 of the second redistribution structure 600 may be effectively reduced to 1 μm to 30 μm. Furthermore, as mentioned above, since the die 300 is coupled to the first redistribution structure 200 through flip-chip bonding, the DAF or the FOW utilized in conventional package structure for adhering the die may be eliminated. Due to the elimination of various layers (such as certain dielectric layers in the second redistribution structure 600 and the DAF/FOW), the overall thickness of the subsequently formed package structure may be effectively reduced to fulfill the slim and compact requirements.

Figure 1G:
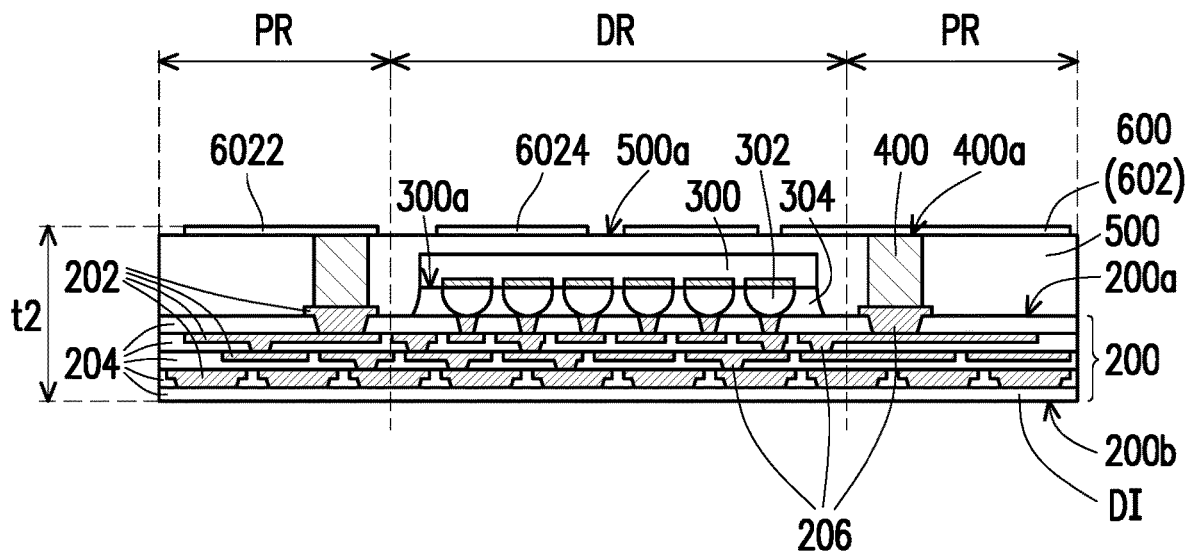

Referring to FIG. 1G, the first redistribution structure 200 is separated from the carrier 100 such that the second surface 200b of the first redistribution structure 200 is exposed. For example, the bottommost dielectric layer DI may be exposed. In some embodiments, the de-bonding layer 102 is a LTHC release layer. Upon irradiation with an UV laser, the de-bonding layer 102 and the carrier 100 may be peeled off and removed. It should be noted that the de-bonding process is not limited thereto. Other suitable methods may be used in some alternative embodiments. In some embodiments, the structure illustrated in FIG. 1G has a thickness t2 of 100 μm to 550 μm.

Figure 1H:
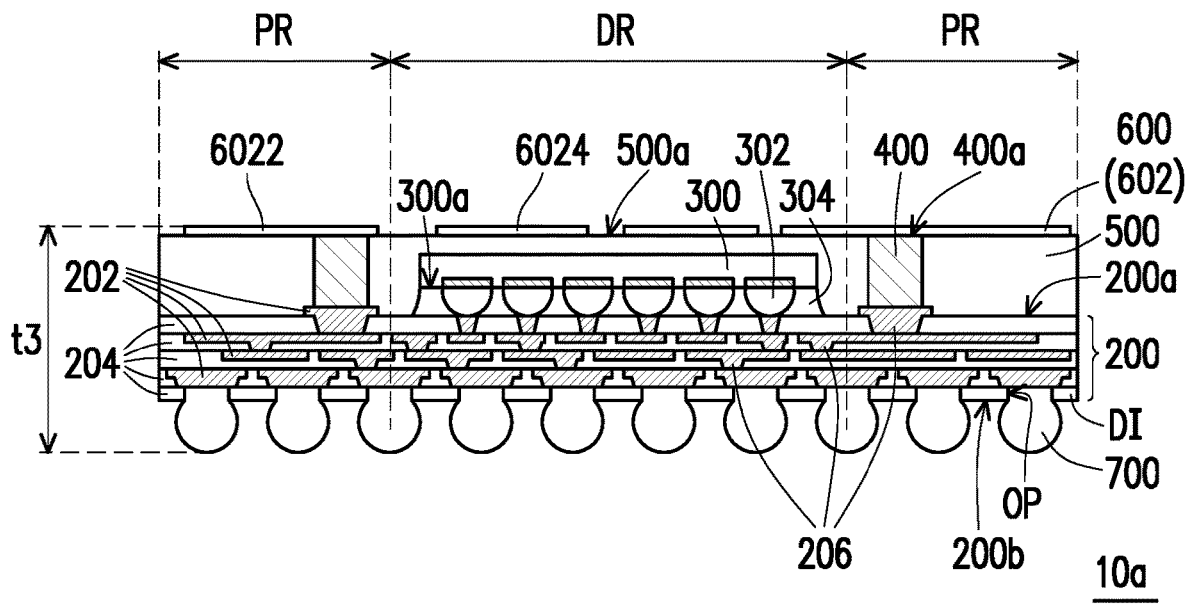

Referring to FIG. 1H, after removing the de-bonding layer 102 and the carrier 100, the bottommost dielectric layer DI is patterned such that a plurality of contact openings OP is formed to partially expose the bottommost layer of the redistribution conductive layers 202 (the bottommost redistribution conductive layer 202) for electrical connection. In some embodiments, the contact openings OP of the bottommost dielectric layer DI are formed by a laser drilling process, a mechanical drilling process, a photolithography process, or other suitable processes. In some embodiments, a plurality of conductive terminals 700 is formed on the bottommost redistribution conductive layer 202 and over the second surface 200b of the first redistribution structure 200 to form a first package structure 10a. In some embodiments, the first package structure 10a is formed to have a thickness t3 ranges between 150 μm and 600 μm. As mentioned above, the second redistribution structure 600 has a thickness t1 of 1 μm to 30 μm. Therefore, in some embodiments, a ratio of the thickness t1 of the second redistribution structure 600 to a ratio of the thickness t3 of the first package structure 10a ranges between 1:5 and 1:600. In other words, the second redistribution structure 600 is 0.17% to 20% of the first package structure 10a in terms of thickness. In certain embodiments, the bottommost redistribution conductive layer 202 is exposed from the bottommost dielectric layer DI, and the exposed bottommost redistribution conductive layer 202 includes under-ball metallurgy (UBM) patterns for ball mount. The conductive terminals 700 are formed on the respective UBM patterns. In some embodiments, part of the conductive terminals 700 are electrically connected to the die 300 through the first redistribution structure 200 and the conductive bumps 302 underneath the die 300. On the other hand, another part of the conductive terminals 700 are electrically connected to the second redistribution structure 600 through the first redistribution structure 200 and the conductive structures 400. In some embodiments, the conductive terminals 700 are attached to the UBM patterns through a solder flux (not shown). In some embodiments, the conductive terminals 700 are, for example, solder balls or ball grid array (BGA) balls. In some embodiments, the conductive terminals 700 may be disposed on the UBM patterns by a ball placement process or a reflow process.

Figure 1I:
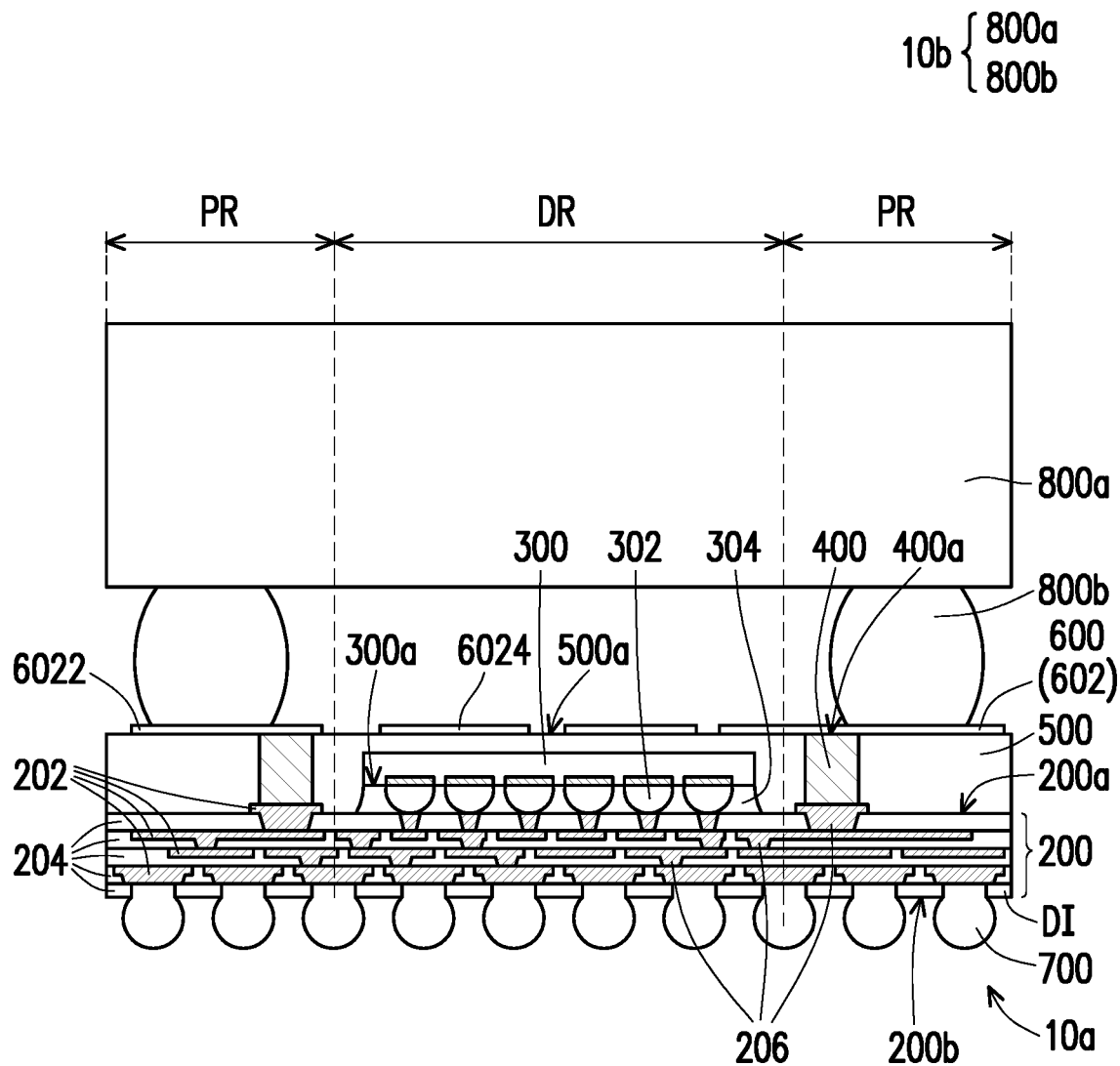

Referring to FIG. 1I, a second package structure 10b is stacked on the first package structure 10a. In some embodiments, the second package structure 10b includes a package body 800a and a plurality of connection terminals 800b attached to the package body 800a. In some embodiments, the package body 800a of the second package structure 10b includes, for example, at least a memory device. However, the disclosure is not limited thereto. Other package structures may be adopted as the second package structure 10b based on the functional demand of the PoP structure. The connection terminals 800b of the second package structure 10b may be similar to the conductive terminals 700 of the first package structure 10a. For example, the connection terminals 800b are solder balls or ball grid array (BGA) balls. In some embodiments, the connection terminals 800b may be attached to the package body 800a through a ball placement process and/or a reflow process. In some embodiments, the connection terminals 800b are disposed on the ball pads 6022 located in the peripheral region PR. In some alternative embodiments, the connection terminals 800b are disposed on the ball pads 6022 located in both the peripheral region PR and the die attachment region DR. In some embodiments, the package body 800a of the second package structure 10b is electrically connected to the first package structure 10a through the connection terminals 800b. In other words, the space above the die 300 may be utilized for ball mount, thereby rendering flexibility in circuit design.

Figure 1J:
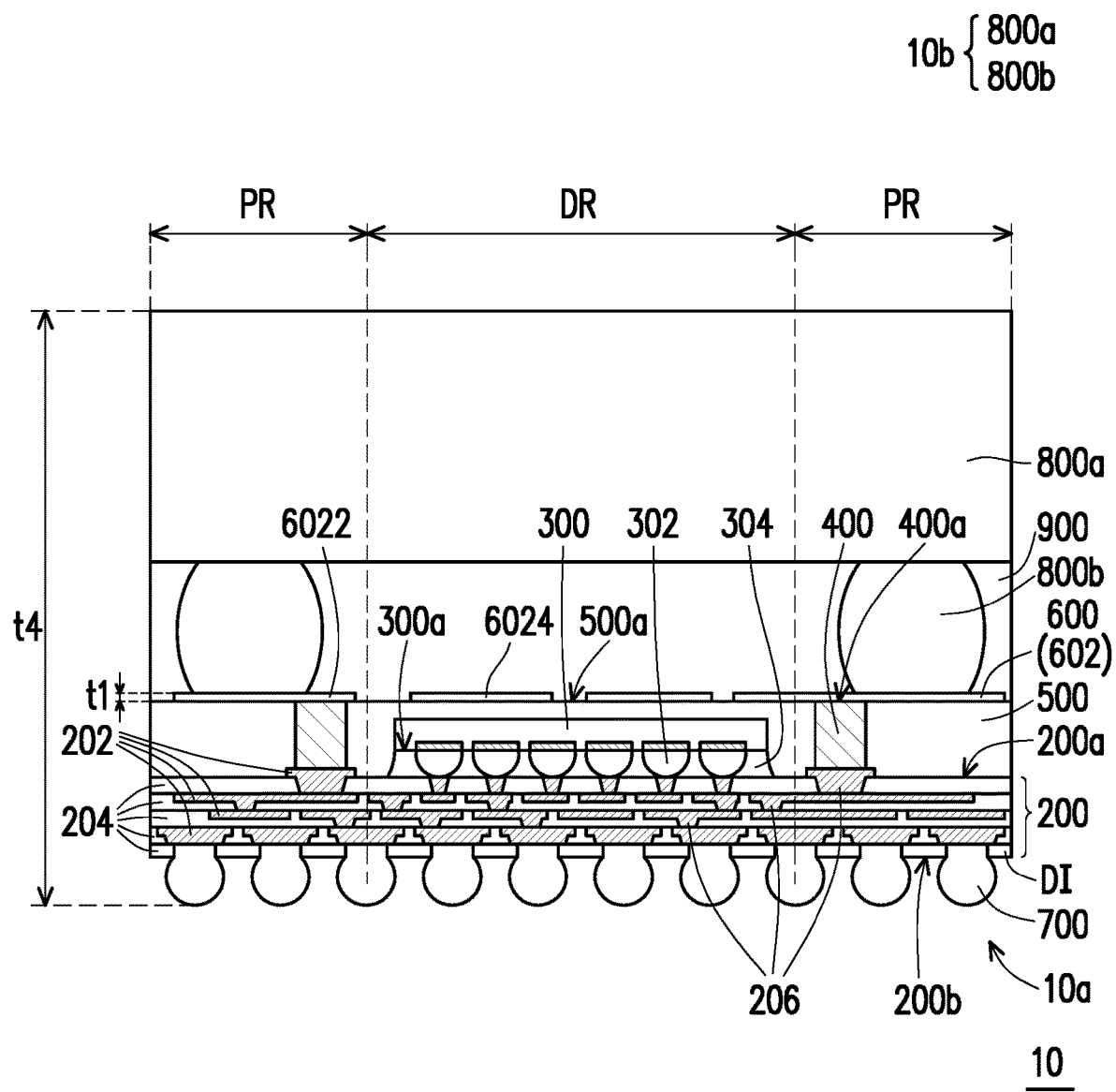

Referring to FIG. 1J, after the second package structure 10b is stacked over the first package structures 10a, an underfill layer 900 is formed to obtain the PoP structure 10. In some embodiments, the underfill layer 900 is filled into the gaps between the first package structure 10a, the package body 800a, and the connection terminals 800b. In some alternative embodiments, the underfill layer 900 is optionally formed and may be omitted. In some embodiments, the underfill layer 900 may be similar to the underfill layer 304 of the first package structure 10a to enhance the reliability of the attachment process. In some embodiments, a thickness t4 of the PoP structure 10 ranges from 730 µm to 1000 µm.

As mentioned above, due to the elimination of various layers (such as certain dielectric layers in the second redistribution structure 600 and the DAF/FOW), the overall thickness of the first package structure 10a may be effectively reduced as compared to the conventional package structure. Since the PoP structure 10 is formed by stacking the second package structure 10b over the first package structure 10a, due to the slim feature of the first package structure 10a, the overall thickness t4 of the PoP structure 10 may also be sufficiently reduced. For example, comparing with the conventional package structures or the conventional PoP structures, a reduction of 10% to 35% in thickness may be attained.

Figure 2:
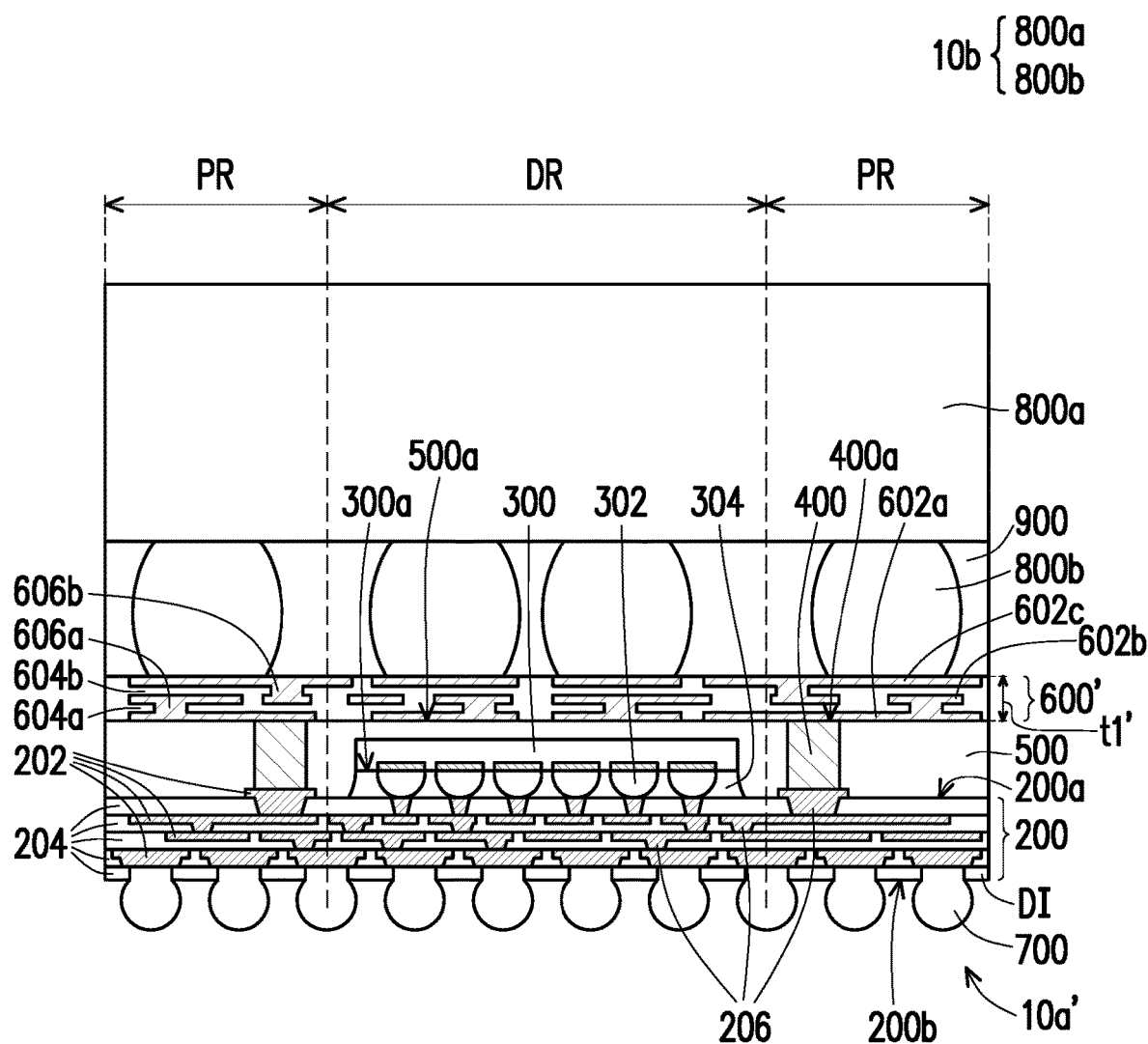
FIG. 2 is a schematic cross-sectional view illustrating a PoP structure in accordance with some alternative embodiments of the disclosure.

FIG. 2 is a schematic cross-sectional view illustrating a PoP structure 20 in accordance with some alternative embodiments of the disclosure. Referring to FIG. 2, the PoP structure 20 in FIG. 2 is similar to the PoP structure 10 illustrated in FIG. 1J, and the difference lies in that in the PoP structure 20 of FIG. 2, the second redistribution structure 600' of the first package structure 10a' is a multi-layered structure. In some embodiments, the second redistribution structure 600' includes a plurality of conductive pattern layers 602a, 602b, 602c and a plurality of dielectric layers 604a, 604b stacked alternately. The dielectric layers 604a, 604b are respectively sandwiched between two adjacent conductive pattern layers 602a, 602b, 602c. For example, the dielectric layer 604a is sandwiched between the conductive pattern layer 602a and the conductive pattern layer 602b. On the other hand, the dielectric layer 604b is sandwiched between the conductive pattern layer 602b and the conductive pattern layer 602c. The conductive pattern layers 602a, 602b, 602c are electrically interconnected through conductive vias 606a, 606b penetrating through/embedded in the dielectric layers 604a, 604b. In some embodiments, the second redistribution structure 600' is formed to have a thickness t1' of 1 µm to 30 µm.

In some embodiments, at least a portion of the topmost conductive pattern layer (conductive pattern layer 602c) and at least a portion of the bottommost conductive pattern layer (conductive pattern layer 602a) are respectively exposed by the topmost dielectric layer (dielectric layer 604b) and the bottommost dielectric layer (dielectric layer 604a). The bottommost conductive pattern layer (conductive pattern layer 602a) is in physical contact with the encapsulant 500 and the conductive structures 400. On the other hand, the topmost conductive pattern layer (conductive pattern layer 602c) may include a plurality of ball pads and serve the purpose of electrical connection with other components formed subsequently. In some embodiments, the foregoing pads are referred to as under-ball metallurgy (UBM) patterns for ball mount. In some embodiments, the material of the conductive pattern layers 602a, 602b, 602c and the conductive vias 606a, 606b includes aluminum, titanium, copper, nickel, tungsten, and/or alloys thereof. The conductive pattern layers 602a, 602b, 602c may be formed by, for example, electroplating, deposition, and/or photolithography and etching. In some embodiments, the material of the dielectric layers 604a, 604b includes polyimide, epoxy resin, acrylic resin, phenol resin, benzocyclobutene (BCB), polybenzoxazole (PBO), or any other suitable polymer-based dielectric material. The dielectric layers 604a, 604b, for example, may be formed by suitable fabrication techniques such as spin-on coating, chemical vapor deposition (CVD), plasma-enhanced chemical vapor deposition (PECVD) or the like. It should be noted that the number of the conductive pattern layers and the dielectric layers presented in FIG. 2 merely serves as an exemplary illustration and does not intended to limit the disclosure. In some alternative embodiments, the number of conductive pattern layers and the dielectric layers may be more or less as compared to the illustration provided in FIG. 2 based on circuit design requirements.

In some embodiments, due to the sequence of the process steps, after the formation of the first redistribution structure 200, the conductive pattern layer 602a of the second redistribution structure 600' is formed directly on the encapsulant 500 without forming one or more dielectric layer between the conductive pattern layer 602a and the encapsulant 500.

In certain embodiments, since the conductive pattern layer 602a of the second redistribution structure 600' is directly in physical contact with the conductive structures 400 and no dielectric layer exists there-between, laser drilling for removing the dielectric layer and exposing the conductive structures be omitted. Therefore, the overall production cost may be reduced. In addition, as no dielectric layer is formed between the encapsulant 500 and the conductive pattern layer 602a and no DAF/FOW layer is formed between the die 300 and the conductive pattern layer 602a, void issues seen in the conventional dielectric layer and the conventional adhesive layer may be eliminated, thereby further improving the planarity of the package structure. As a result, the breakage of the conductive traces/routing patterns in the redistribution structure may be sufficiently eliminated, so as to enhance the reliability of the package structure. Moreover, in some embodiments, since the conductive pattern layer 602a of the second redistribution structure 600 is directly formed on the encapsulant 500 with no dielectric layer exists there-between, the thickness t1' of the second redistribution structure 600' may be effectively reduced to 1 µm to 30 µm. Furthermore, as mentioned above, since the die 300 is coupled to the first redistribution structure 200 through flip-chip bonding, the DAF or the FOW utilized in conventional package structure for adhering the die may be eliminated. Due to the elimination of various layers (such as certain dielectric layers in the second redistribution structure 600' and the DAF/FOW), the overall thickness of the PoP structure 20 may be effectively reduced to fulfill the slim and compact requirements.

In accordance with some embodiments of the disclosure, an integrated fan-out package includes a first redistribution structure, a die, an encapsulant, a plurality of conductive structures, and a second redistribution structure. The first redistribution structure has a first surface and a second surface opposite to the first surface. The die is disposed over the first surface of the first redistribution structure and is electrically connected to the first redistribution structure. The encapsulant encapsulates the die. The conductive structures are disposed on the first surface of the first redistribution structure and penetrates the encapsulant. The conductive structures surround the die. The second redistribution structure is disposed on the encapsulant and is electrically connected to the first redistribution structure through the conductive structures. The second redistribution structure includes at least one conductive pattern layer that is in physical contact with the encapsulant.

In accordance with some alternative embodiments of the disclosure, a package-on-package (PoP) structure includes a first package structure and a second package structure stacked on the first package structure. The first package structure includes a first redistribution structure, a die, a plurality of conductive structures, an encapsulant, and a conductive pattern layer. The first redistribution structure has a die attachment region and a peripheral region surrounding the die attachment region. The die is disposed over the die attachment region of the first redistribution structure. The conductive structures are disposed over the peripheral region of the first redistribution structures. The encapsulant encapsulates the die and the conductive structures. The conductive pattern layer is disposed over and in physical contact with the encapsulant. The conductive pattern layer is electrically connected to the first redistribution structure through the conductive structures and includes a plurality of ball pads and a plurality of routing patterns.

In accordance with some embodiments of the disclosure, a method for manufacturing a package-on-package (PoP) structure includes at least the following steps. First a carrier is provided. Subsequently, a first package structure is formed. Thereafter, a second package structure is stacked over the first package structure. The first package structure is formed by at least the following steps. First, a first redistribution structure is formed over the carrier. The first redistribution structure has a first surface and a second surface opposite to the first surface and the second surface faces the carrier. Subsequently, a die and a plurality of conductive structures are provided/formed over the first surface of the redistribution structure. The conductive structures surround the die. The die and the conductive structures are encapsulated by an encapsulant. Thereafter, a second redistribution structure is formed on the encapsulant. The second redistribution structure is electrically connected to the first redistribution structure through the conductive structures. The second redistribution structure includes at least one conductive layer that is in physical contact with the encapsulant. Afterwards, the carrier is separated and removed from the first redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package-on-package (POP) structure, comprising:
   a first package structure, comprising:
      a first redistribution structure having a die attachment region and a peripheral region surrounding the die attachment region;
      a die bonded to the first redistribution structure, wherein the die is located within the die attachment region;
      a plurality of conductive structures in physical contact with the first redistribution structure, wherein the plurality of conductive structures is located in the peripheral region to surround the die;
      an encapsulant laterally encapsulating the die and the plurality of conductive structures, wherein a height of each of the plurality of conductive structures is smaller than a thickness of the encapsulant; and
      a conductive pattern layer disposed over and in physical contact with a top surface of the encapsulant and top surfaces of the plurality of conductive structures, wherein an entire bottom surface of the conductive pattern layer is located at a same level height, and an entirety of the top surface of the encapsulant and an entirety of the top surfaces of the plurality of conductive structures are located at the same level height; and
   a second package structure stacked on the first package structure.

2. The POP structure according to claim 1, further comprising a plurality of conductive terminals disposed over the first redistribution structure opposite to the die.

3. The POP structure according to claim 1, wherein the second package structure comprises a package body and a plurality of connection terminals attached to the package body, and the package body is electrically connected to the first package structure through the plurality of connection terminals.

4. The POP structure according to claim 3, further comprising an underfill layer filling gaps between the first package structure, the package body, and the plurality of connection terminals.

5. The POP structure according to claim 3, wherein the connection terminals are disposed over the conductive pattern layer.

6. The POP structure according to claim 1, wherein the die is electrically connected to the first redistribution structure through a plurality of conductive bumps.

7. The POP structure according to claim 1, wherein a ratio of a thickness of the conductive pattern layer to a thickness of the first package structure ranges from 1:5 to 1:600.

8. A manufacturing method of a package-on-package (PoP) structure, comprising:
 providing a carrier;
 forming a first package structure, comprising:
  forming a first redistribution structure over the carrier, wherein the first redistribution structure has a die attachment region and a peripheral region surrounding the die attachment region;
  forming a plurality of conductive structures in physical contact with the first redistribution structure;
  bonding a die to the first redistribution structure through flip-chip bonding, wherein the die is located within the die attachment region, and the plurality of conductive structures is located in the peripheral region to surround the die;
  encapsulating the die and the plurality of conductive structures by an encapsulant, wherein a height of each of the plurality of conductive structures is smaller than a thickness of the encapsulant;
  forming a second redistribution structure on the encapsulant, wherein the second redistribution structure is electrically connected to the first redistribution structure through the plurality of conductive structures, the second redistribution structure comprises at least one conductive pattern layer that is in physical contact with a top surface of the encapsulant and top surfaces of the plurality of conductive structures, the top surfaces of the plurality of conductive structures contacting the second redistribution structure are coplanar with the top surface of the encapsulant, an entire bottom surface of the at least one conductive pattern layer is located at a same level height, and an entirety of the top surface of the encapsulant and an entirety of the top surfaces of the plurality of conductive structures are located at the same level height; and
  removing the carrier from the first redistribution structure; and
 stacking a second package structure over the first package structure.

9. The method according to claim 8, further comprising forming a plurality of conductive terminals over the first redistribution structure after removing the carrier from the first redistribution structure.

10. The method according to claim 8, wherein forming the second redistribution structure comprises forming a plurality of conductive pattern layers and forming a plurality of dielectric layers sandwiched between two adjacent conductive pattern layers, and a bottommost conductive pattern layer of the plurality of conductive pattern layers is in physical contact with the encapsulant.

11. The method according to claim 10, wherein a topmost conductive pattern layer of the plurality of conductive pattern layers comprises a plurality of ball pads and a plurality of routing patterns.

12. The method according to claim 11, wherein the second package structure comprises a package body and a plurality of connection terminals attached to the package body, and the plurality of connection terminals is disposed over the plurality of ball pads such that the package body is electrically connected to the first package structure through the plurality of connection terminals.

13. The method according to claim 12, further comprising forming an underfill layer to fill gaps between the first package structure, the package body, and the plurality of connection terminals.

14. A package-on-package (POP) structure, comprising:
 a first package structure, comprising:
  a first redistribution structure;
  a die bonded to the first redistribution structure;
  a plurality of conductive structures disposed around the die;
  an encapsulant laterally encapsulating the die and the plurality of conductive structures, wherein a height of each of the plurality of conductive structures is smaller than a thickness of the encapsulant; and
  a conductive pattern layer disposed over and in physical contact with a top surface of the encapsulant and top surfaces of the plurality of conductive structures, wherein an entirety of the top surface of the encapsulant and an entirety of the top surfaces of the plurality of conductive structures are located at a same level height, and an entire bottom surface of the conductive pattern layer is located at a same level height; and
 a second package structure stacked on the first package structure.

15. The POP structure according to claim 14, further comprising a plurality of conductive terminals disposed over the first redistribution structure opposite to the die.

16. The POP structure according to claim 14, wherein the conductive pattern layer comprises a plurality of ball pads and a plurality of routing patterns.

17. The POP structure according to claim 16, wherein the plurality of conductive structures are in physical contact with the plurality of ball pads.

18. The POP structure according to claim 16, wherein the second package structure comprises a package body and a plurality of connection terminals attached to the package body.

19. The POP structure according to claim 18, wherein the plurality of connection terminals are in physical contact with the plurality of ball pads.

20. The POP structure according to claim 18, further comprising an underfill layer wrapping around the plurality of connection terminals.

* * * * *